(12) United States Patent
Davy (10) Patent No.: US 11,611,308 B2
(45) Date of Patent: Mar. 21, 2023

(54) WINDOW INSERTS COMPRISING ULTRAVIOLET-ABSORBING AND VISIBLY TRANSPARENT PHOTOVOLTAIC DEVICES PRODUCING ON-BOARD ELECTRICITY

(71) Applicant: Andluca Technologies Inc., Princeton, NJ (US)

(72) Inventor: Nicholas C. Davy, Philadelphia, PA (US)

(73) Assignee: Andluca Technologies Inc., Princeton, NJ (US)

( * ) Notice: Subject to any disclaimer, the term of this patent is extended or adjusted under 35 U.S.C. 154(b) by 0 days.

(21) Appl. No.: 16/675,821

(22) Filed: Nov. 6, 2019

(65) Prior Publication Data

US 2020/0144960 A1 May 7, 2020

Related U.S. Application Data

(60) Provisional application No. 62/756,432, filed on Nov. 6, 2018.

(51) Int. Cl.
| | |
|---|---|
| H02S 20/26 | (2014.01) |
| H02S 30/10 | (2014.01) |
| H02S 40/22 | (2014.01) |
| H02S 40/38 | (2014.01) |
| H01L 51/00 | (2006.01) |
| H01L 51/42 | (2006.01) |
| H01L 51/44 | (2006.01) |
| H01L 27/30 | (2006.01) |

(52) U.S. Cl.
CPC ............ *H02S 20/26* (2014.12); *H01L 27/302* (2013.01); *H01L 51/0097* (2013.01); *H01L 51/4253* (2013.01); *H01L 51/448* (2013.01); *H02S 30/10* (2014.12); *H02S 40/22* (2014.12); *H02S 40/38* (2014.12); *H01L 51/004* (2013.01); *H01L 51/0056* (2013.01)

(58) Field of Classification Search
None
See application file for complete search history.

(56) References Cited

U.S. PATENT DOCUMENTS

| | | | |
|---|---|---|---|
| 6,476,312 B1 | 11/2002 | Barnham | |
| 9,331,298 B2 | 5/2016 | Lunt et al. | |
| 10,439,090 B2 | 10/2019 | Lunt et al. | |
| 10,476,018 B2 | 11/2019 | Loo et al. | |
| 10,510,914 B2 | 12/2019 | Lunt, III et al. | |
| 10,809,588 B2 * | 10/2020 | Yu | H02S 20/26 |

(Continued)

OTHER PUBLICATIONS

Davy et al., "Pairing of near-ultraviolet solar cells with electrochromic windows for smart management of the solar spectrum", Nature Energy, 2, All Pages. Jun. 30, 2017. (Year: 2017).*

*Primary Examiner* — Daniel P Malley, Jr.
(74) *Attorney, Agent, or Firm* — Nutter McClennen & Fish LLP (57) ABSTRACT

In one aspect, window inserts are described herein, which can modulate transmission of electromagnetic radiation through a window and can be self-powered. In some embodiments, a window insert comprises a photovoltaic device, the photovoltaic device including a photosensitive layer having peak absorption between 250 nm and 450 nm and an average transmittance of at least 50 percent in the visible region of the electromagnetic spectrum.

25 Claims, 7 Drawing Sheets

(56) References Cited

U.S. PATENT DOCUMENTS

| | | |
|---|---|---|
| 2008/0149165 A1 | 6/2008 | Hoeks et al. |
| 2011/0240120 A1 | 10/2011 | Ronda et al. |
| 2017/0317305 A1* | 11/2017 | Hammond ........ B32B 17/10036 |
| 2017/0359016 A1* | 12/2017 | Kim ...................... H01L 25/047 |
| 2019/0190438 A1* | 6/2019 | Hack ................... H01L 51/5203 |
| 2020/0395885 A1* | 12/2020 | Janowski ................ H02S 20/26 |

* cited by examiner

WINDOW INSERTS COMPRISING ULTRAVIOLET-ABSORBING AND VISIBLY TRANSPARENT PHOTOVOLTAIC DEVICES PRODUCING ON-BOARD ELECTRICITY

RELATED APPLICATION DATA

The present application claims priority pursuant to 35 U.S.C § 119(e) to U.S. Provisional Patent Application Ser. No. 62/756,432 filed Nov. 6, 2018, which is incorporated herein by reference in its entirety.

FIELD

The present invention relates to photovoltaic devices and, in particular, to apparatus employing photovoltaic devices for modulation of light transmission.

BACKGROUND

Optoelectronic devices using organic materials are increasingly desirable in a variety of applications for a number of reasons. Materials used to construct organic optoelectronic devices are relatively inexpensive in comparison to their inorganic counterparts, thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

Optoelectronic devices have been increasingly employed in window applications for buildings, homes and vehicles. However, installation and operation of such devices can be costly, and options to retrofit existing structures with optoelectronic devices are limited.

SUMMARY

In one aspect, window inserts are described herein. As detailed further below, the window inserts can modulate transmission of electromagnetic radiation through a window and can be self-powered. In some embodiments, a window insert comprises a photovoltaic device, the photovoltaic device including a photosensitive layer having peak absorption between 250 nm and 450 nm and an average transmittance of at least 50 percent in the visible region of the electromagnetic spectrum. The photosensitive layer, in some embodiments, comprises non-fullerene organic semiconductors. The photosensitive layer, for example, can comprise an organic electron donor and an organic electron acceptor, and the photovoltaic device employs a single junction architecture generating an open-circuit voltage ($V_{OC}$) of at least 1.4 V. In some embodiments, single junction photovoltaic devices employed in window inserts are described in U.S. patent application Ser. No. 15/577,965 which is incorporated herein by reference in its entirety. A window insert can also comprise an electrically dimmable assembly for modulating or regulating the transmission of visible and/or infrared electromagnetic radiation through the window insert. The electrically dimmable assembly can be powered by the photovoltaic device, thereby simplifying electrical architecture of the window insert. In some embodiments, electrical infrastructure of the window insert is positioned in a siding or gasket coupled to the window insert perimeter.

In another aspect, methods of modulating the transmission of electromagnetic radiation through a window are provided. Briefly, a method of modulating comprises arranging a window insert in the path of electromagnetic radiation passing through the window or façade, the window insert comprising an electrically dimmable assembly and photovoltaic device including a photosensitive layer having peak absorption between 250 nm and 450 nm and an average transmittance of at least 50 percent in the visible region of the electromagnetic spectrum. Ultraviolet radiation is converted to electrical energy by the photovoltaic device, and the electrically dimmable assembly is powered with the electrical energy to alter the transmission of visible and/or infrared radiation through the window insert.

These and other embodiments are described further in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

As described herein, window inserts are provided for fenestration comprising a unique combination of ultraviolet-absorbing/visibly-transparent photovoltaic devices and monolithically-integrated electrically-dimmable thin films and/or low-emission films and/or environmental sensors that results in solar-powered regulation of visible and near-infrared light, and is thus a free-standing product not requiring external power. In some embodiments, the light-active layers of the insert comprise, in order of sunlight incidence, i) a photovoltaic and/or luminescent solar concentrator set of layers that primarily harvest ultraviolet light, while transmitting the majority of visible and near-infrared light; and ii) in some embodiments, an electrically-dimmable set of layers that primarily regulate transmission of visible and/or near-infrared light; and iii) in some embodiments, a low-emission set of layers that primarily serves to reflect infrared light. In some embodiments of the window insert, the ultraviolet-absorbing visibly-transparent photovoltaic device layer also provides power to on-board hardware including i) sensors, such as temperature and humidity sensors; and/or ii) energy-storage elements, such as batteries and/or capacitors; and/or iii) wireless communication devices, such as Wi-Fi and/or Bluetooth adapters.

In some embodiments, the window insert permits integration of transparent photovoltaic or transparent luminescent solar concentrator layers, that convert sunlight into on-board electricity, with on-board sensors and/or electrically-dimmable layers and/or low-emission layers, that regulate sunlight transmission to optimize lighting conditions and control solar heat gain. Technical advancements lie in the selective harvesting of non-visible light for on-board electricity, monolithically-integrated with complementary functional layers such as electrically-dimmable layers that require electrical power for operation. In some embodiments, the inserts comprise hardware elements such as internal wiring; energy storage in the form of batteries and/or capacitors; a series of temperature, light, humidity and other environmental sensors; and a wireless communication element operating at a frequency between 200 MHz-10 GHz.

When the above elements are combined according to the designs detailed herein and provided in the figures, the result is a free-standing, self-powered smart window insert that can be utilized adjacent to and over the same spatial area as existing fenestration to provide on-board power for sensor-based data collection of environmental conditions, and/or solar-powered regulation of sunlight transmission, without requiring external power or installation by an electrician or window glazier. The immediate applications for such products are in augmenting fenestration in buildings, automobiles, airplanes, trains, and marine craft. On-board transparent solar power uniquely enables a free-standing, retrofittable, window upgrade solution for a diverse range of applications. With the described window insert, smart window function can be endowed to existing windows without the cost and complexity of replacing the existing glass with an externally-wired double- or triple-pane insulated smart glass window unit. Inserts described herein comprise, in part or in whole, a transparent photovoltaic or transparent luminescent solar concentrator layer or set of layers for purposes of providing on-board power.

The window inserts, in one aspect, comprise a light-harvesting element that is a single-junction photovoltaic device comprising organic semiconductors as active ingredients. In such embodiments, organic electron donor and acceptor layers exhibit peak absorbance in the range 250 nm to 450 nm. Therefore, the photovoltaic active layer is largely transparent to light in the visible and near-infrared regions. For example, the photovoltaic active layer can generally exhibit an average transmittance in the visible light region of 60 percent to 100 percent. In such an embodiment, the ultraviolet absorbers utilized in the single-junction organic solar cell can be fabricated using one or a combination of vacuum deposition, chemical vapor deposition, spin-coating, blade-coating, spray-coating, or other solution or roll-to-roll process. Suitable electron donor and electron acceptor layers, in some embodiments are disclosed in U.S. patent application Ser. No. 15/577,965.

In a second aspect, a light-harvesting element comprises a transparent luminescent concentrator film including organic semiconductors as active ingredients, wherein the active ingredients primarily absorb ultraviolet light and emit visible and/or near-infrared light. In such embodiments, organic ultraviolet-absorbers exhibit peak absorbance in the range 250 nm to 450 nm and peak emission in the range 500-1000 nm. The luminescent concentrator film area is largely transparent to light in the visible and near-infrared regions. For example, the photovoltaic active layer can generally exhibit an average transmittance in the visible light region of 70 percent to 100 percent. In some embodiments, the ultraviolet absorbers utilized in the luminescent concentrator film can be fabricated using one or a combination of drop-casting, spin-coating, blade-coating, spray-coating, extruding, injection-molding, laminating, or other solution or roll-to-roll process. Suitable organic ultraviolet absorbers can comprise one or more contorted hexabenzocoronene (cHBC) derivatives. In some embodiments, for example, a luminophore is tetrabenzofuranyldibenzocoronene. Luminophores can be dispersed in various polymeric matrices to form the luminescent concentrator film. Any suitable transparent polymeric material can be employed including, but not limited to, polyacrylates, polyalkylacrylates, polycarbonates, and polyethylene terephthalate.

Various designs of the window inserts are detailed in the figures, with insert data for two exemplary embodiments of the ultraviolet (UV) solar layer that produced electricity for on-board power. The ultraviolet (UV) solar layer is expected to absorb between 50-100% of solar irradiation having wavelengths <420 nm, prior to transmission of the remaining solar photons i) internally to adjacent, monolithic layers such as electrically-dimmable layers and/or low-emission layers; and/or ii) through the window insert.

For applications previously utilizing externally-powered, electrically-dimmable double-pane insulating glass units installed via window glaziers and electricians, inserts having composition and architectures described herein will substantially reduce the cost and complexity of delivering dynamic sunlight transmission functions by decoupling these functions from electrician and window glazier labor. The window inserts can potentially lead to widespread augmentation of existing fenestration with electrically-dimmable glass or film technologies that are not presently available in a retrofittable fenestration product.

Figure 1:
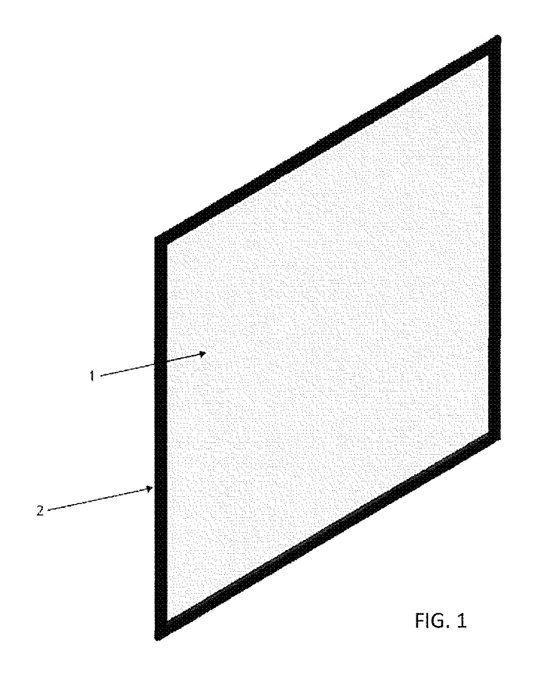
FIG. 1 is a perspective view of a window insert according to some embodiments described herein.

FIG. 1 is a perspective view of a reversibly installable smart window insert comprising one or more supplemental panes of glass, acrylic or other transparent substrates 1 with edge-mounted insulation or frame 2 such as an insulating foam, gasket, or thermal edge spacer that serves to create a thermally insulated air gap between the removable smart window insert and the permanent installed glass façade.

Figure 2:
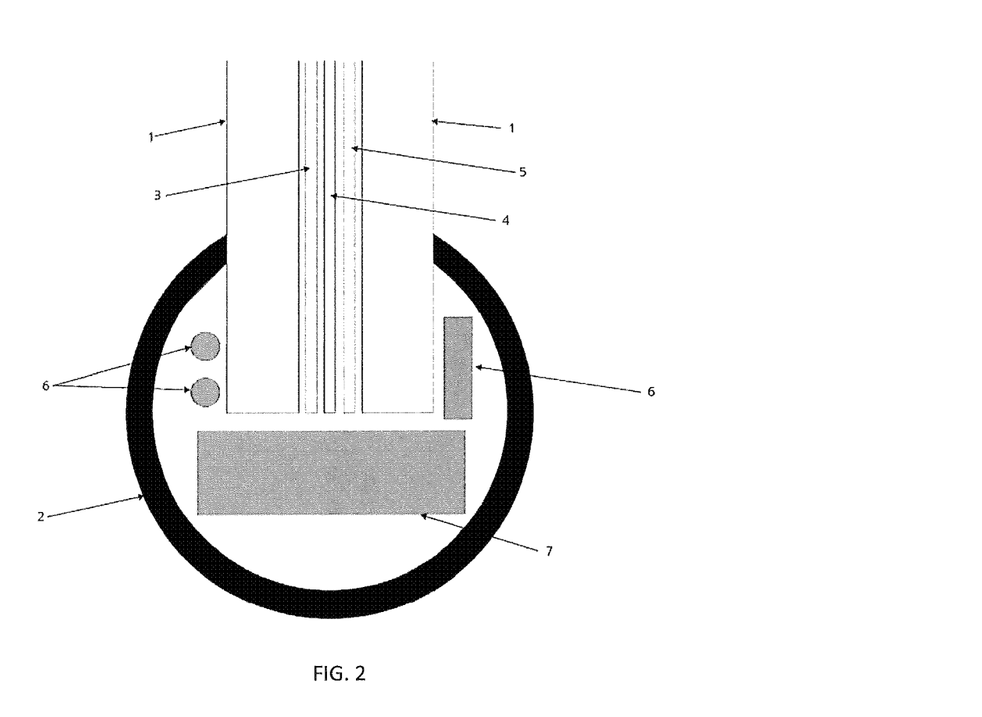
FIG. 2 is a cross-sectional view of a window insert according to some embodiments described herein.

FIG. 2 is a cross-sectional view of a reversibly installable smart window insert comprising one or more supplemental panes glass, acrylic or other transparent substrates 1 with edge-mounted insulation or frame 2 such as insulating foam, gasket, or thermal edge spacer that serves to create a thermally insulated air gap between the removable smart window insert and the permanent glass façade. The ultraviolet solar layer or layers 3 comprising either a transparent organic photovoltaic cell or cell array or a transparent luminescent solar concentrator film or energy-harvesting device is positioned closest to the permanent glass façade. The electrically-dimmable layer or layers 4 are positioned after the ultraviolet solar layer or layers with respect to the permanent glass façade. The electrically-dimmable layers can be electrochromic films encapsulated by glass panes and laminated monolithically to the ultraviolet solar layers, or the electrically-dimmable layers 4 can be separated from the ultraviolet solar layer or layers 3 by an air gap. The low-emission film 5 can be deposited or laminated monolithically as the terminating layers of the electrically-dimmable layers or deposited or laminated separately onto a glass or other transparent substrate that is positioned after the electrically-dimmable layers with respect to the permanent glass façade. The edge-mounted insulation or frame 2 can house one or more electrical components 6 including sensors, energy-storage elements, and wireless communication elements. The edge-mounted insulation or frame 2 can house conventional opaque photovoltaic solar cells 7 for collection of indirect solar illumination and/or harvesting of light emitted by the ultraviolet solar layer 2 and waveguided via one or more glass or other transparent substrates 1 to the edges of the smart window insert.

Figure 3A:
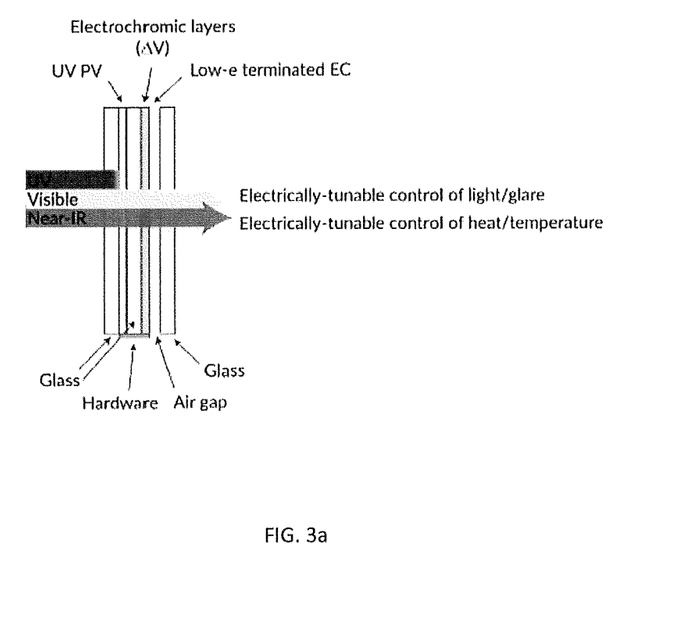
FIGS. 3a-3c illustrate cross-sectional views of window inserts and associated functional characteristics of various layers according to some embodiments described herein.
Figure 3B:
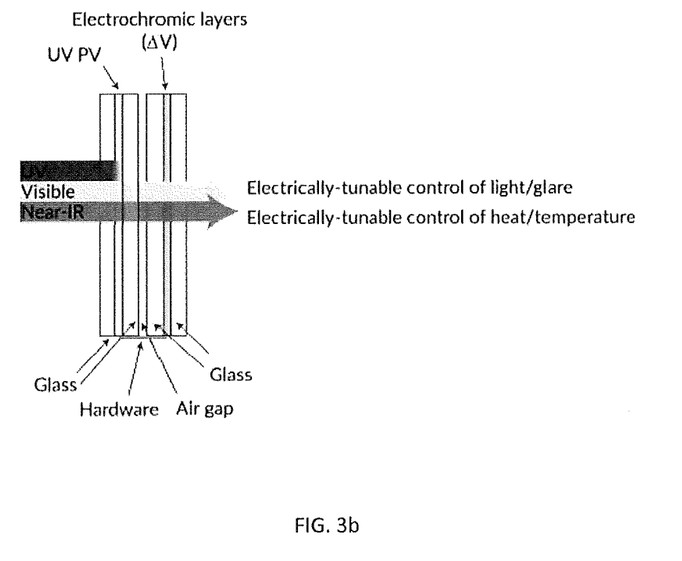
Figure 3C:
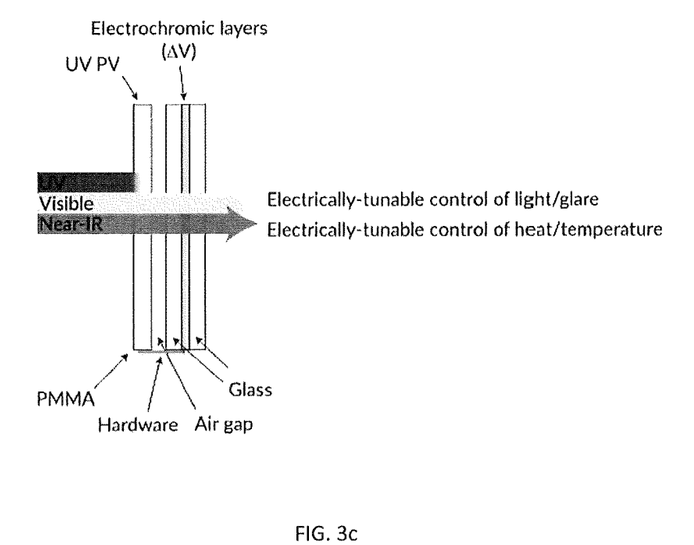

FIGS. 3a-c illustrate in cross-sectional views the functions of each optically-active layer or pane in exemplary embodiments of smart window inserts having a variety of arrangements and glass or transparent substrate configurations. In all configurations an ultraviolet photovoltaic layer "UV PV" is the optically-active layer positioned nearest the permanent glass façade. The smart window insert may comprise monolithically-integrated UV PV and electrically-dimmable or electrochromic layers or panes, as seen in FIG. 3A, and the electrically-dimmable or electrochromic layers may be terminated by one or more low-emission layers. The smart window insert may comprise UV PV and electrically-dimmable or electrochromic layers or panes that are spatially separated by an air gap, as seen in FIG. 3B. The smart window insert may comprise a one-pane UV PV layer—such as an acrylic sheet of thickness 1 mm to 6 mm with embedded ultraviolet-absorbing dyes—that is spatially separated by an air gap from one or more electrically-dimmable or electrochromic layers or panes, as illustrated in FIG. 3C.

Figure 4:
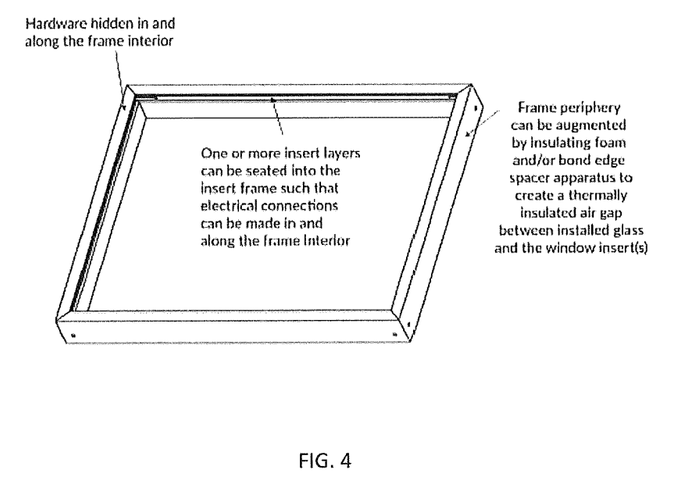
FIG. 4 is a perspective view of an edge-mounted frame for housing one or more inserts according to some embodiments described herein.

FIG. 4 is a perspective view of an edge-mounted frame for housing one or more smart insert layers that can be seated into the frame such that electrical connections can be made in and along the frame interior. The frame periphery can be augmented by insulating foam and/or bond edge spacers to create one or more thermally insulated air gaps between the permanent glass façade and the smart window insert or inserts. Hardware can be hidden from view by housing one or more electrical components in and along the frame interior. The purpose of the edge-mounted frame is to temporarily secure the smart window insert or inserts to the permanent glass façade in a removable format while providing thermal insulation between the building interior and the permanent glass façade.

Figure 5:
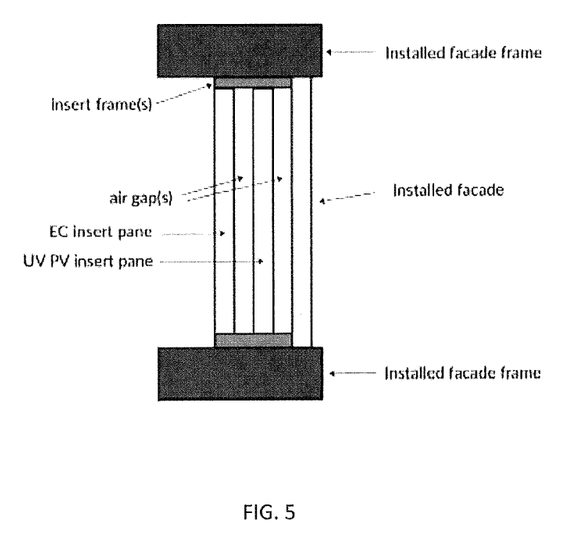
FIG. 5 is a cross-sectional view of reversible installation of a window insert system according to some embodiments described herein.

FIG. 5 is a cross-sectional view of an exemplary embodiment of a reversible installation of a smart window insert system comprising an ultraviolet photovoltaic "UV PV" pane and an electrochromic "EC" pane held by an edge-mounted frame "insert frame(s)" that fits within the installed façade frame. The smart window insert system is spatially separated by an air gap from the permanent glass façade and has the UV PV pane positioned nearest the installed glass façade. The smart window insert frame fits within the installed façade frame and is necessarily smaller dimensionally in length, width, and depth than the installed façade frame. The purpose of the smart window system is thus to harvest ultraviolet light for powering of in-window electrical components and/or electrically-dimmable layers or panes. The smart window insert system differs from prior art detailing integrated photovoltaic and electrochromic insulating glass units for new construction or building renovation that are permanently installed by a window glazier and in some cases also an electrician. The present invention can be reversibly installed and/or replaced or upgraded without necessarily requiring specialized labor including window glaziers or electricians. The present invention prolongs the life of the original building façade by enabling reversible upgrading of installed windows with supplemental panes that can be periodically maintained or replaced in a non-disruptive manner.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A reversibly installable smart window insert for a permanent installed façade frame comprising:
   a photovoltaic device, the photovoltaic device including a photosensitive layer having peak absorption between 250 nm and 450 nm and an average transmittance of at least 50 percent in the visible region of the electromagnetic spectrum, the photovoltaic device configured to be adjacent a permanent installed glass facade;
   one or more supplemental panes of transparent substrates; and
   an edge-mounted frame comprising:
      a frame interior, the frame interior configured to house:
         the photovoltaic device and the one or more supplemental panes of transparent substrates; and
         one or more electrical components selected from the group consisting of light sensors, color sensors, humidity sensors, temperature sensors, occupancy sensors, motion sensors, cellular signal amplifiers, universal serial bus interfaces, and wireless communication elements; and
      a frame periphery, the frame periphery configured to:
         be augmented by an edge-mounted insulation to provide a thermally insulated air gap between the photovoltaic device and the permanent installed glass façade; wherein the one or more electrical components are within the edge-mounted insulation
         be reversibly installable; and
         temporarily secure the smart window insert to the permanent installed façade frame, wherein:
            the permanent installed glass façade is permanently mounted in the permanent installed façade frame; and
            the permanent installed glass façade remains permanently mounted in the permanent installed façade frame when the smart window insert is removed from the permanent installed façade frame.

2. The window insert of claim 1, wherein the photosensitive layer comprises non-fullerene organic semiconductors.

3. The window insert of claim 1, wherein the photosensitive layer comprises an organic electron donor and an organic electron acceptor, and the photovoltaic device comprises a single junction architecture generating an open circuit voltage (Voc) of at least 1.4 V.

4. The window insert of claim 3, wherein the organic electron donor and organic electron acceptor do not comprise fullerene moieties.

5. The window insert of claim 1, wherein the photosensitive layer has a peak emission in the range of 500 nm to 1000 nm.

6. The window insert of claim 3, wherein the organic electron donor comprises a first contorted hexabenzocoronene (cHBC) or cHBC derivative, and the electron acceptor comprises a second cHBC or cHBC derivative.

7. The window insert of claim 6, wherein the first cHBC or second cHBC is tetrabenzofuranyldibenzocoronene.

8. The window insert of claim 3, wherein the photovoltaic device comprises a tandem device or two junction architecture generating an open circuit voltage (Voc) of at least 2.4 V.

9. The window insert of claim 3, wherein the photovoltaic device is fabricated on a flexible substrate having a width between 1 cm and 200 cm.

10. The window insert of claim 1, wherein the photovoltaic device is encapsulated or laminated between two glass sheets.

11. The window insert of claim 1 further comprising an electrically dimmable assembly regulating the transmission of visible and/or infrared electromagnetic radiation through the window insert.

12. The window insert of claim 1 further comprising a low emission film layer for reducing transmission of infrared electromagnetic radiation through the window insert.

13. The window insert of claim 1 further comprising a charge storage device in electrical communication with the photovoltaic device.

14. The window insert of claim 11, wherein the electrically dimmable assembly is powered by the photovoltaic device.

15. The window insert of claim 1, wherein the one or more electrical components are powered by the photovoltaic device.

16. The window insert of claim 1, wherein the photosensitive layer comprises one or more contorted hexabenzocoronene (cHBC) derivatives as luminophores embedded in a polymer matrix.

17. The window insert of claim 16, wherein the luminophore is tetrabenzofuranyldibenzocoronene.

18. The window insert of claim 16, wherein the polymer matrix is at least 50% polymethyl methacrylate (PMMA) by mass.

19. The window insert of claim 16, wherein the polymer matrix is at least 50% polyvinyl butyral by mass.

20. The window insert of claim 1, wherein the photosensitive layer is a film that can be applied to or laminated by one or more glass sheets.

21. The window insert of claim 1, wherein the photosensitive layer is encapsulated between two pieces of glass.

22. The window insert of claim 1, wherein the photosensitive layer is coupled to edge-mounted photovoltaic devices for harvesting of visible light emitted by the luminophores and waveguided by the polymer matrix or one or more glass substrates.

23. The window insert of claim 1, wherein the window insert is held by the edge-mounted frame that is mechanically fastened to the installed façade frame.

24. The window insert of claim 1, wherein the window insert is removable from the path of electromagnetic radiation.

25. The window insert of claim 1, wherein:
the transparent substrates comprises at least one of glass, acrylic, or another transparent material; and
the edge-mounted insulation comprises an insulating foam, a gasket, or a thermal edge spacer.

* * * * *

UNITED STATES PATENT AND TRADEMARK OFFICE
CERTIFICATE OF CORRECTION

| | |
|---|---|
| PATENT NO. | : 11,611,308 B2 |
| APPLICATION NO. | : 16/675821 |
| DATED | : March 21, 2023 |
| INVENTOR(S) | : Nicholas C. Davy |

It is certified that error appears in the above-identified patent and that said Letters Patent is hereby corrected as shown below:

In the Claims

At Column 6, Claim number 1, Line number 35, please replace ";" with --,--

At Column 6, Claim number 1, Line number 37, please add --;-- after "insulation"

Signed and Sealed this
Sixteenth Day of May, 2023

*Katherine Kelly Vidal*

Katherine Kelly Vidal
*Director of the United States Patent and Trademark Office*